(12) United States Patent
Cho et al.

(10) Patent No.: US 12,270,854 B2
(45) Date of Patent: Apr. 8, 2025

(54) BENCHMARK DEVICE AND METHOD FOR EVALUATING A SEMICONDUCTOR WAFER

(71) Applicant: TAIWAN SEMICONDUCTOR MANUFACTURING COMPANY LTD., Hsinchu (TW)

(72) Inventors: Lan-Chou Cho, Hsinchu (TW); Chewn-Pu Jou, Hsinchu (TW); Stefan Rusu, Sunnyvale, CA (US)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 385 days.

(21) Appl. No.: 17/843,942

(22) Filed: Jun. 17, 2022

(65) Prior Publication Data
US 2023/0408578 A1    Dec. 21, 2023

(51) Int. Cl.
*G01R 31/303* (2006.01)
*G01R 31/28* (2006.01)
*G02B 6/34* (2006.01)
*G02B 6/12* (2006.01)

(52) U.S. Cl.
CPC ....... *G01R 31/303* (2013.01); *G01R 31/2884* (2013.01); *G02B 6/34* (2013.01); *G02B 2006/12107* (2013.01); *G02B 2006/1215* (2013.01)

(58) Field of Classification Search
None
See application file for complete search history.

(56) References Cited

U.S. PATENT DOCUMENTS

| | | | |
|---|---|---|---|
| 10,520,392 B1* | 12/2019 | Chen | G02B 6/30 |
| 2014/0268120 A1* | 9/2014 | Assefa | G01N 21/9501 |
| | | | 356/237.5 |
| 2021/0080295 A1* | 3/2021 | Qamar | G01M 11/30 |

* cited by examiner

*Primary Examiner* — Jerry Rahll
(74) *Attorney, Agent, or Firm* — WPAT LAW; Anthony King

(57) ABSTRACT

A benchmark device and a method for evaluating a semiconductor wafer are provided. The benchmark device includes a first grating coupler, a second grating coupler and a waveguide. The waveguide has a least one bending section and is arranged in communication with the first grating coupler and the second grating coupler. The bending section comprises a first region having a first width and a first height, and a second region having a second width and a second height, wherein the first region is surrounded by the second region, and the second width decreases gradually from a first end of the bending section to a second end of the bending section.

20 Claims, 13 Drawing Sheets

BENCHMARK DEVICE AND METHOD FOR EVALUATING A SEMICONDUCTOR WAFER

BACKGROUND

The present disclosure relates, in general, to a benchmark device and its operating method. Specifically, the present disclosure relates to a benchmark device and its operating method for evaluating a semiconductor wafer.

Process control monitoring (PCM) devices have been widely used for various applications, such as monitoring the characteristics or performance of a semiconductor device. The PCM device can include several optical components and electronic elements, which may increase the size of the PCM device while diminishing its reliability.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures can be arbitrarily increased or reduced for clarity of discussion.

DETAILED DESCRIPTION

Figure 1:
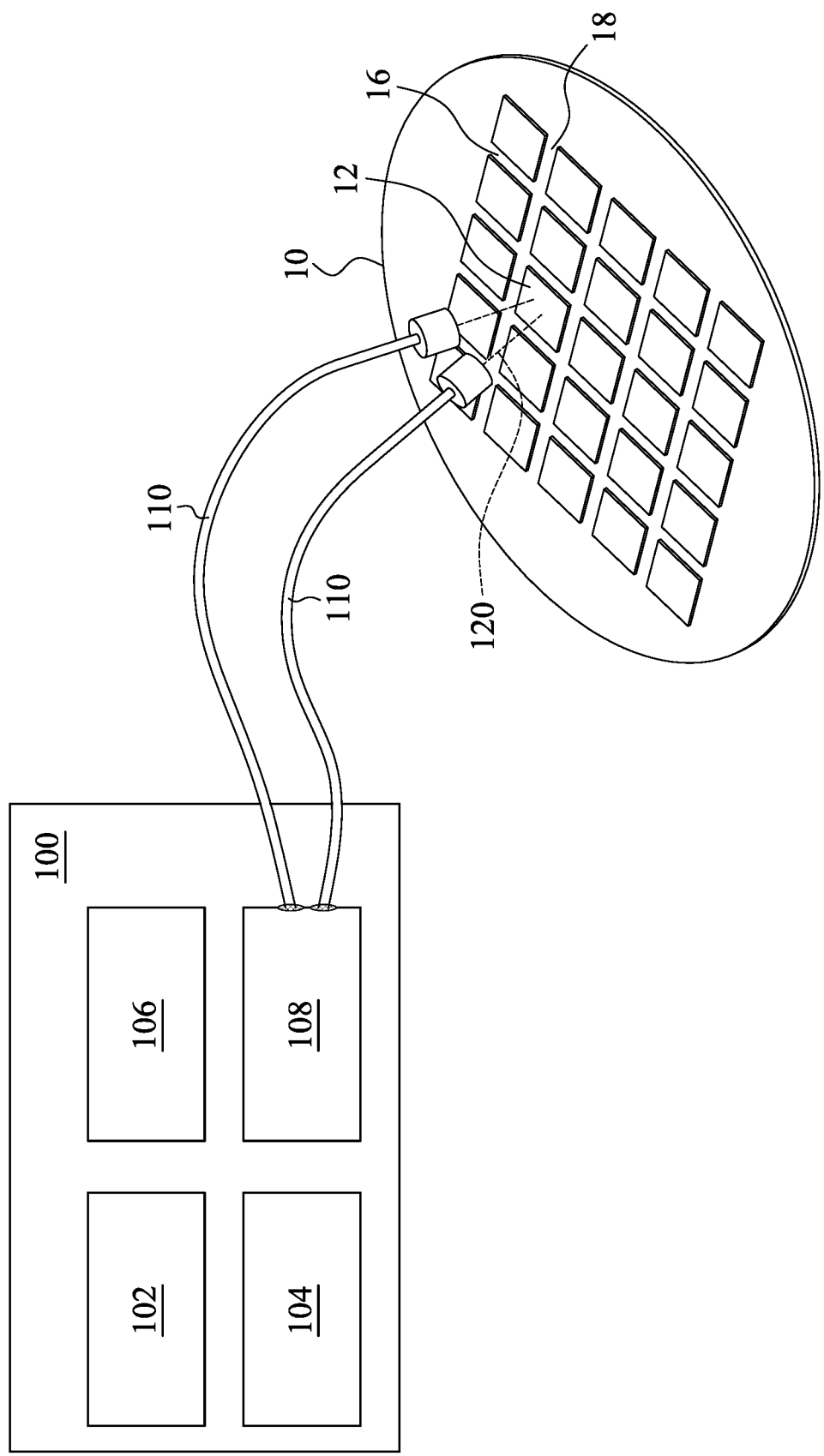
FIG. 1 is a schematic view of a system for measuring and evaluating a semiconductor wafer, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features can be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a schematic view of a system 100 for measuring and evaluating a semiconductor wafer 10, in accordance with some embodiments of the present disclosure. FIG. 1 shows a system 100 for testing a semiconductor wafer. FIG. 1 also shows a semiconductor wafer 10 on which a semiconductor die to be tested or measured can be included.

The semiconductor wafer 10 can include an elementary semiconductor such as silicon, germanium, or diamond. The semiconductor wafer 10 may include one or more dies 12 formed thereon. A plurality of scribe lines 16 and 18 can be provided between adjacent dies 12 so that dies 12 can be separated or singulated in subsequent processing. In some embodiments, the dies 12 can be integrated circuits (ICs) or chips. The semiconductor wafer 10 may include a plurality of dies 12 and several process control monitoring (PCM) devices (not shown in FIG. 1A). A PCM device can be regarded as a benchmark device that can be utilized to evaluate the characteristics or performance of the dies 12.

A PCM device may include one or more basic components that are utilized to constitute the circuits within the dies 12. Therefore, the characteristics and performance of the circuits within the dies 12 can be evaluated after the characteristics and performance of the one or more basic components are obtained. The PCM devices can be used to monitor the characteristics of the dies 12 during a wafer acceptance test (WAT). The PCM device can be formed in a scribe line, a street, or other locations not occupied by the circuits within the dies 12 on the semiconductor wafer 10. In some embodiments, the PCM device can be formed in scribe lines 16 or 18.

Referring to FIG. 1, the system 100 can be testing or measurement equipment. The system 100 may include hardware and software components that provide a suitable operational or functional environment for the dies 12 to be tested. In some embodiments, the system 100 may include a processor 102, a signal generator 104, a monitor 106, and a coupler 108.

Signals and commands can be transmitted between each of the processor 102, the signal generator 104, the monitor 106, and the coupler 108. In some embodiments, the signals transmitted within the system 100 can include power signals having adjustable voltage levels. In some embodiments, the signals transmitted within the system 100 can include optical signals having various frequencies.

In various embodiments, the processor 102 may include, but is not limited to, at least one hardware processor, including at least one microprocessor such as a CPU, a portion of at least one hardware processor, or any other suitable dedicated processor such as those developed based on Field Programmable Gate Array (FPGA) and Application Specific Integrated Circuit (ASIC).

The signal generator 104 is configured to provide test signals. All types of optical signals and electrical signals, such as data signals, clock signals, or power signals, can be provided to a PCM device associated with the die 12. In some embodiments, electrical signals can also be provided to the die 12 directly.

The monitor 106 is configured to determine whether the PCM device complies with a test criterion. The signals fed back from the PCM device can be evaluated by the monitor 106, and a determination can be made whether the PCM device complies with the test criterion. The monitor 106 can provide/display information and/or instructions to the user. In some embodiments, the monitor 106 can display pop-up notifications. In some embodiments, the monitor 106 can provide alarm messages to the user when the PCM device fails to comply with certain test criteria.

The coupler 108 is configured to couple the signal generator 104 to the PCM device on the semiconductor wafer 10. In some embodiments, the coupler 108 can be coupled to the PCM device by one or more waveguides 110. The waveguides 110 can transmit or emit optical signals on the PCM device of the wafer to measure characteristics and performance of the semiconductor wafer 10.

The waveguides 110 can be electrically coupled to test conductive contacts (pads) and/or bonding pads disposed on the PCM devices. The waveguides 110 can optically couple to input/output (I/O) terminals of the PCM devices. The test conductive pads and/or bonding pads provide electrical connections to an interconnect structure (e.g., wiring) of the dies. For example, some of the waveguides 110 can be coupled to pads that are associated with a supply terminal (e.g., Vdd) and ground terminal (e.g., Vss) of the PCM device. Other waveguides can be coupled to pads associated with I/O terminals (e.g., data signals or optical signals) of the PCM device. As such, the system 100 is operable to apply electrical signals or optical signals to the PCM device and obtain response/feedback signals from the PCM device during WAT.

Figure 2A:
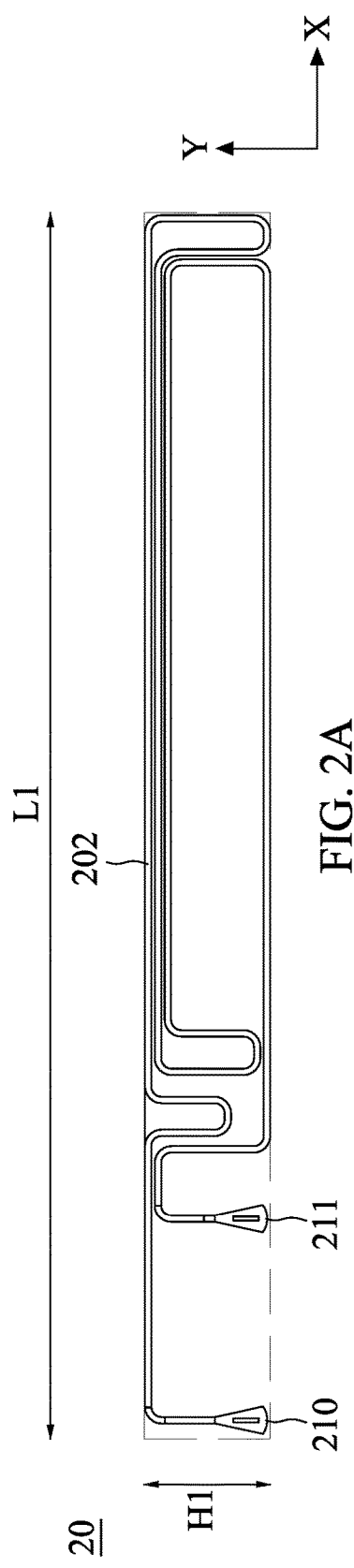
FIG. 2A is a schematic view of a benchmark device for evaluating a semiconductor wafer, in accordance with some embodiments of the present disclosure.

FIG. 2A is a schematic view of a benchmark device 20 for evaluating the semiconductor wafer 10, in accordance with some embodiments of the present disclosure. The benchmark device 20 includes a waveguide 202 and grating couplers 210 and 211. The waveguide 202 can transmit or feed back optical signals for testing the semiconductor wafer 10. The grating couplers 210 and 211 could be the input and output of the benchmark device 20. The benchmark device 20 could be an optical process control monitor (OPCM) device. As shown in FIG. 2A, the waveguide 202 can be provided between the grating couplers 210 and 211. The waveguide 202 can be arranged in electrical communication with the grating couplers 210 and 211. The waveguide 202 can be arranged in optical communication with the grating couplers 210 and 211.

The benchmark device 20 of FIG. 2A can be embedded within the semiconductor wafer 10 of FIG. 1. The benchmark device 20 can be arranged in the scribe lines 16 and 18. The benchmark device 20 can be located along the scribe lines 16 and 18. The benchmark device 20 can be provided in contact with the PCM device of the semiconductor wafer 10. The benchmark device 20 can be a portion of the PCM device of the semiconductor wafer 10.

The benchmark device 20 of FIG. 2A can in communication with the system 100 of FIG. 1. The benchmark device 20 of FIG. 2A can receive or feed back optical signal from/to the system 100 of FIG. 1. Optical signals received from/transmitted to the waveguide 110 of the system 100 of FIG. 1 can propagate in the waveguide 202 of FIG. 2A. The grating couplers 210 and 211 of FIG. 2A can functions as I/O terminals in communication with the coupler 108 of the system 100 of FIG. 1.

In some embodiments, the benchmark device 20 can be formed in a rectangular area. The waveguide 202 can be formed in the shape of a spiral or helix. The benchmark device 20 can be provided within a rectangular area to be compacted and save space. As shown in FIG. 2A, the rectangular area has a length L1 and a height H1. The length L1 could be regarded as the longer edge (along X direction) of the rectangular area. The height H1 could be regarded as the shorter edge (along Y direction) of the rectangular area.

In some embodiments, the height H1 may be smaller than 300 μm. The height H1 may be in a range of 40 to 240 μm. The height H1 may exceed 100 μm. In some embodiments, the length L1 may be smaller than 50 mm. The length L1 may be in a range of 0.1 to 32 mm. The length L1 may exceed 1 mm.

Figure 2B:
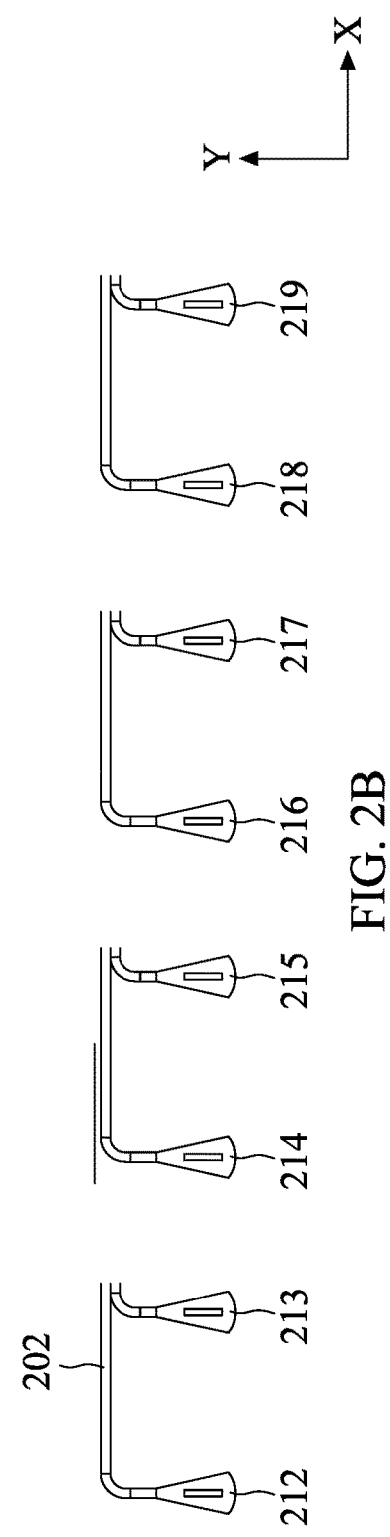
FIG. 2B is a schematic view of grating couplers of a benchmark device, in accordance with some embodiments of the present disclosure.

FIG. 2B is a schematic view of the grating couplers 212 to 219 of the benchmark device 20, in accordance with some embodiments of the present disclosure. The grating couplers 212 to 219 could be arranged perpendicular to the longer edge or X direction of the rectangular area. The grating couplers 212 to 219 could be arranged in parallel with the shorter edge or Y direction of the rectangular area. Note that the illustrated number of the grating couplers 212 to 219 is not to be interpreted in a limiting sense. In other words, the benchmark device 20 may include more than eight grating couplers, or fewer grating couplers.

Figure 2C:
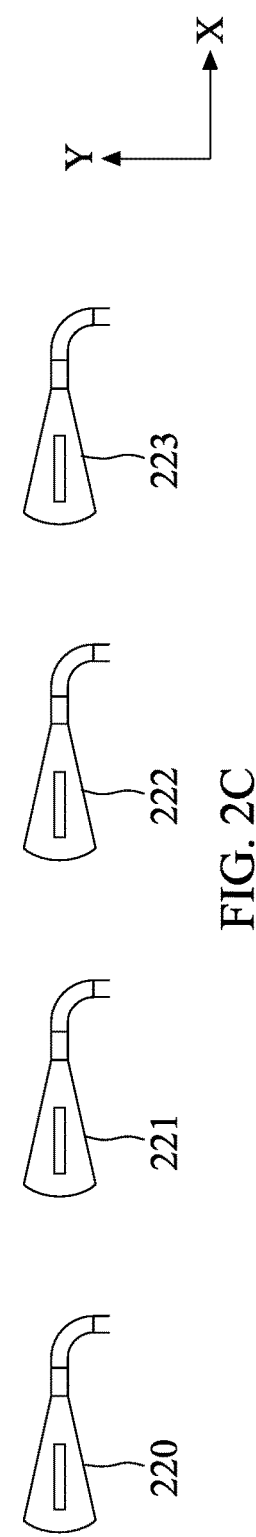
FIG. 2C is another schematic view of grating couplers of a benchmark device, in accordance with some embodiments of the present disclosure.

FIG. 2C is another schematic view of grating couplers 220 to 223 of the benchmark device 20, in accordance with some embodiments of the present disclosure. The grating couplers 220 to 223 could be arranged in parallel with the longer edge or X direction of the rectangular area. The grating couplers 220 to 223 could be arranged perpendicular to the shorter edge or Y direction of the rectangular area. It will be appreciated that the illustrated number of the grating couplers 220 to 223 is not to be interpreted in a limiting sense.

Figure 3A:
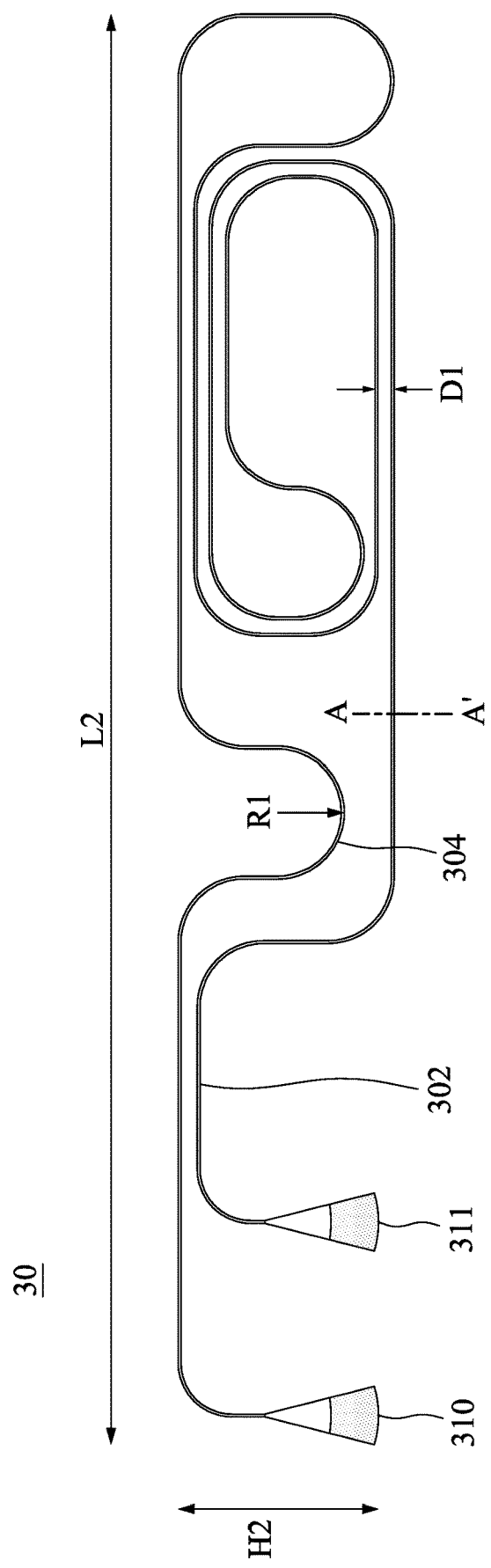
FIG. 3A is a schematic view of a benchmark device for evaluating a semiconductor wafer, in accordance with some embodiments of the present disclosure.

FIG. 3A is a schematic view of a benchmark device 30 for evaluating the semiconductor wafer 10, in accordance with some embodiments of the present disclosure. The benchmark device 30 includes a waveguide 302 and grating couplers 310 and 311 for inputting and outputting optical signals. The waveguide 302 can be arranged in electrical communication with the grating couplers 310 and 311. The waveguide 302 can be arranged in optical communication with the grating couplers 310 and 311.

The benchmark device 30 can be formed in a rectangular area. The benchmark device 30 can be provided within the rectangular area to be compacted and save space. As shown in FIG. 3A, the rectangular area has a length L2 and a height H2. The length L2 could be defined as the longer edge of the rectangular area. The height H2 could be defined as the shorter edge of the rectangular area. The waveguide 302 can be formed in the shape of a spiral or helix to decrease the height H2 and increase the length L2.

In some embodiments, the height H2 may be smaller than 300 μm. The height H2 may be in a range of 40 to 240 μm. The height H2 may exceed 100 μm. In some embodiments, the length L2 may be smaller than 50 mm. The length L2 may be in a range of 0.1 to 32 mm. The length L2 may exceed 1 mm.

As shown in FIG. 3A, the waveguide 302 can have a space which is a distance D1 between adjacent sections of the waveguide 302. The above two sections can be parallel with each other. For example, the distance D1 of the waveguide 302 may be in a range of 1 to 50 μm. In one embodiment, the distance D1 of the waveguide 302 may exceed 10 μm. In some embodiments, the distance D1 of the waveguide 302 may be smaller than 100 μm. The distance D1 of the waveguide 302 can be smaller than the height H2. The distance D1 of the waveguide 302 can be greater than the height H2 and smaller than the length L2.

In some embodiments, the waveguide 302 can have a bending section 304 with a radius R1. The bending section 304 is arranged in communication with the grating couplers 310 and 311. For example, the radius R1 of the bending section 304 may be in a range of 1 to 30 μm. In one embodiment, the radius R1 of the bending section 304 may exceed 10 μm. In some embodiments, the radius R1 of the bending section 304 may be smaller than 50 μm.

The radius R1 of the bending section 304 can be smaller than the height H2. The radius R1 of the bending section 304 can be greater than the height H2 and smaller than the length L2. The radius R1 of the bending section 304 can be substantially equal to the distance D1 of the waveguide 302. The radius R1 of the bending section 304 can be smaller than the distance D1 of the waveguide 302. The radius R1 of the bending section 304 can be greater than the distance D1 of the waveguide 302.

Figure 3B:
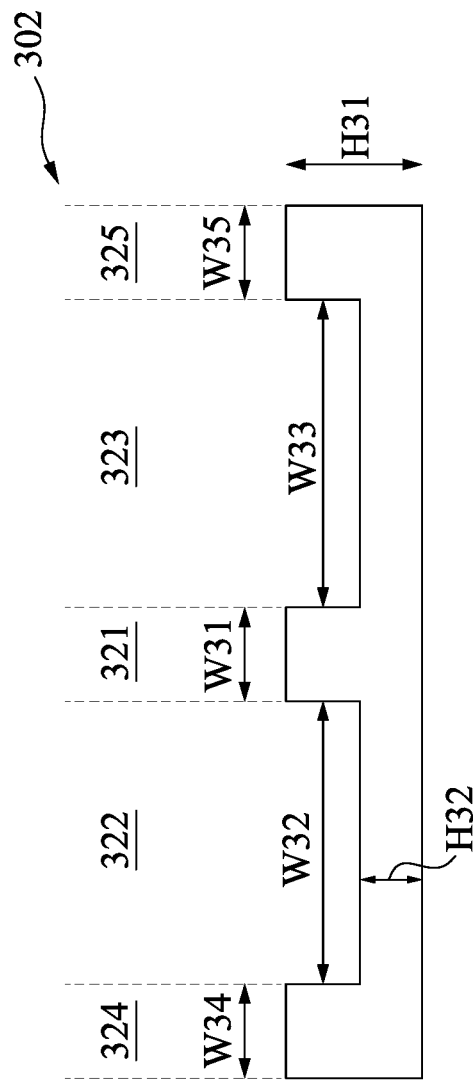
FIG. 3B illustrates a cross-section view of a waveguide of the benchmark device along the section line A-A' in FIG. 3A, in accordance with some embodiments of the present disclosure.

FIG. 3B illustrates a cross-section view of the waveguide 302 of the benchmark device 30 along the section line A-A' in FIG. 3A, in accordance with some embodiments of the present disclosure. The waveguide 302 may include several regions 321 to 325. The region 321 can be a central region. The regions 322 and 323 can be slab regions surrounding the region 321. The regions 324 and 325 can be rib regions adjacent to the regions 322 and 323. In some embodiments, one of the regions 324 and 325 could be omitted in the benchmark device 30. In some embodiments, both of the regions 324 and 325 could be omitted in the benchmark device 30.

The region 321 can be of width W31 and height H31. In some embodiments, the width W31 of the region 321 may be smaller than 20 μm. The width W31 of the region 321 may be in a range of 0.01 to 10 µm. The width W31 of the region 321 may exceed 1 µm. In some embodiments, the height H31 of the region 321 may be smaller than 20 µm. The height H31 of the region 321 may be in a range of 0.01 to 10 µm. The height H31 of the region 321 may exceed 1 µm.

The region 322 can be of width W32 and height H32. The width W32 of the region 322 is greater than the width W31 of the region 321. In some embodiments, the width W32 of the region 322 may be smaller than 20 µm. The width W32 of the region 322 may be in a range of 0.01 to 10 µm. The width W32 of the region 322 may exceed 1 µm.

The height H32 of the region 322 is smaller than the height H31 of the region 321. In some embodiments, the height H32 of the region 322 may be smaller than 15 µm. The height H32 of the region 322 may be in a range of 0 to 10 µm. The height H32 of the region 322 may exceed 0.01 µm.

The region 323 can be of width W33 and height H32. The width W33 of the region 323 is greater than the width W31 of the region 321. The width W33 of the region 323 may be substantially identical to the width W32 of the region 322. In some embodiments, the width W33 of the region 323 may be smaller than 20 µm. The width W33 of the region 323 may be in a range of 0.01 to 10 µm. The width W33 of the region 323 may exceed 1 µm.

The region 324 can be of width W34 and height H31. The width W34 of the region 324 is smaller than the width W32 of the region 322. The width W34 of the region 324 may be substantially identical to the width W31 of the region 321. In some embodiments, the width W34 of the region 324 may be smaller than 20 µm. The width W34 of the region 324 may be in a range of 0 to 10 µm. The width W34 of the region 324 may exceed 1 µm.

The region 325 can be of width W35 and height H31. The width W35 of the region 325 is smaller than the width W32 of the region 322. The width W35 of the region 325 may be substantially identical to the width W31 of the region 321. In some embodiments, the width W35 of the region 325 may be smaller than 20 µm. The width W35 of the region 325 may be in a range of 0 to 10 µm. The width W35 of the region 325 may exceed 1 µm.

Figure 3C:
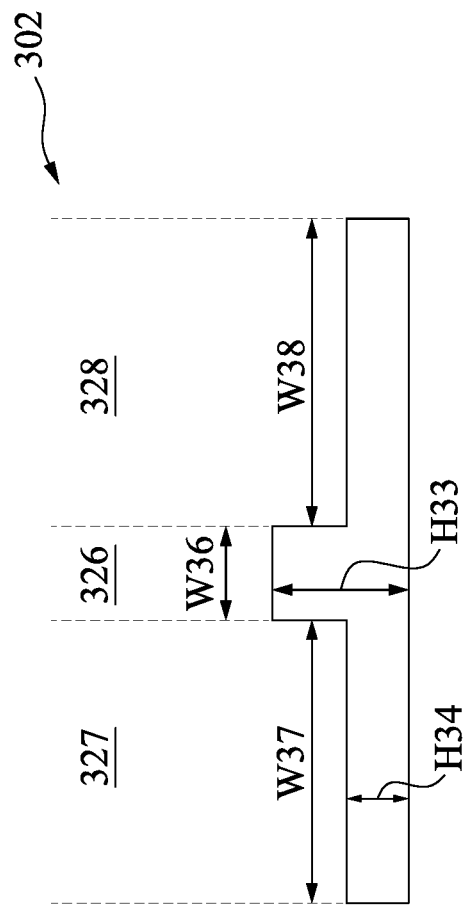
FIG. 3C illustrates another cross-section view of a waveguide of the benchmark device along the section line A-A' in FIG. 3A, in accordance with some embodiments of the present disclosure.

FIG. 3C illustrates another cross-section view of the waveguide 302 of the benchmark device 30 along the section line A-A' in FIG. 3A, in accordance with some embodiments of the present disclosure. Compared to the embodiment of FIG. 3B which includes five regions, three regions are included in the embodiment of FIG. 3C.

The region 326 can be sandwiched by the regions 327 and 328. The region 326 can be of width W36 and height H33. In some embodiments, the width W36 of the region 326 may be smaller than 20 µm. The width W36 of the region 326 may be in a range of 0.01 to 10 µm. The width W36 of the region 326 may exceed 1 µm. In some embodiments, the height H33 of the region 326 may be smaller than 20 µm. The height H33 of the region 326 may be in a range of 0.01 to 10 µm. The height H33 of the region 326 may exceed 1 µm.

The region 327 can be of width W37 and height H34. The width W37 of the region 327 is greater than the width W36 of the region 326. In some embodiments, the width W37 of the region 327 may be smaller than 20 µm. The width W37 of the region 327 may be in a range of 0.01 to 10 µm. The width W37 of the region 327 may exceed 1 µm.

The height H34 of the region 327 is smaller than the height H33 of the region 326. In some embodiments, the height H34 of the region 327 may be smaller than 15 µm. The height H34 of the region 327 may be in a range of 0 to 10 µm. The height H34 of the region 327 may exceed 0.01 µm.

The region 328 can be of width W38 and height H34. The width W38 of the region 328 is greater than the width W36 of the region 326. The width W38 of the region 328 may be substantially identical to the width W37 of the region 327. In some embodiments, the width W38 of the region 328 may be smaller than 20 µm. The width W38 of the region 328 may be in a range of 0.01 to 10 µm. The width W38 of the region 328 may exceed 1 µm.

Figure 4A:
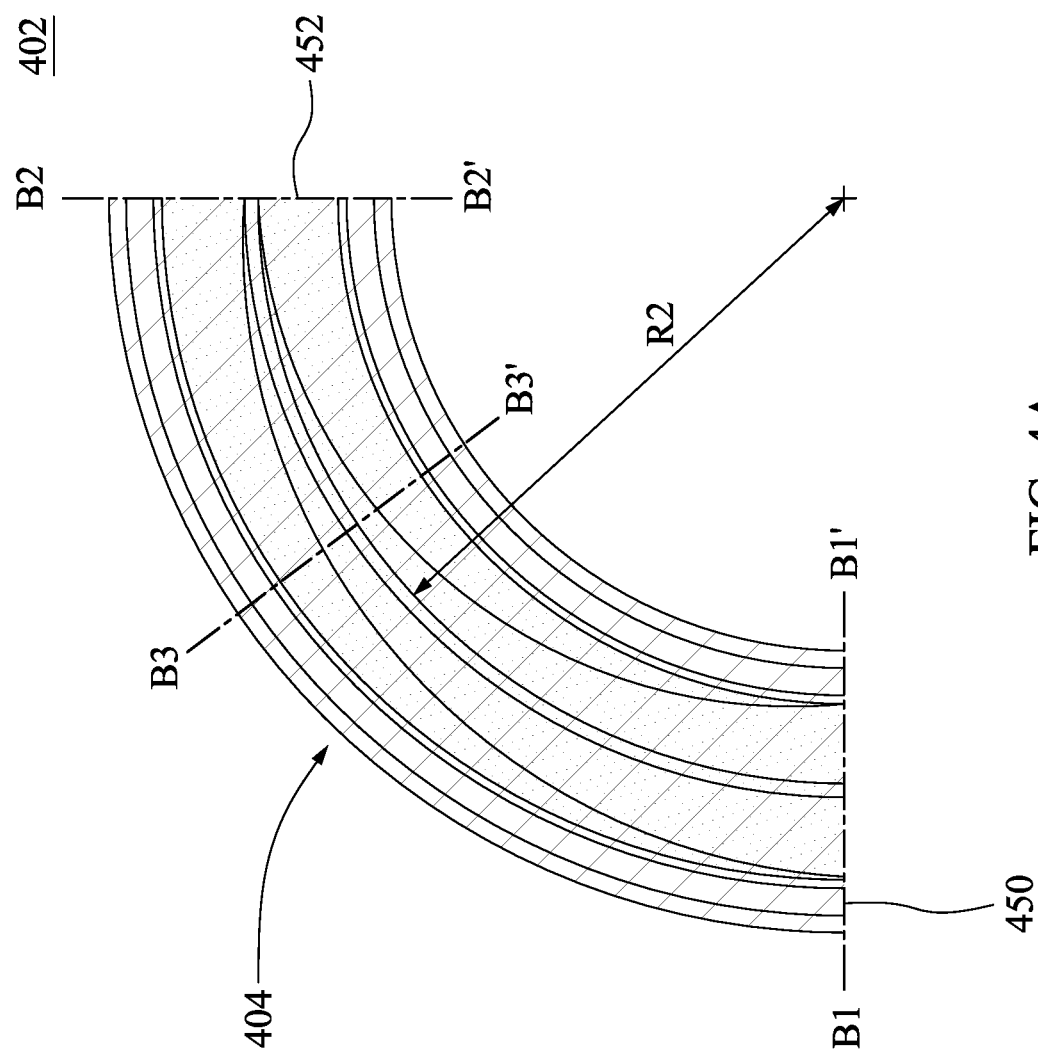
FIG. 4A is a schematic view of a bending section of a waveguide of a benchmark device, in accordance with some embodiments of the present disclosure.

FIG. 4A is a schematic view of a bending section 404 of a waveguide 402 of a benchmark device, in accordance with some embodiments of the present disclosure. The bending section 404 may have a radius R2. For example, the radius R2 of the bending section 404 may be in a range of 1 to 30 µm. The radius R2 of the bending section 404 may exceed 10 µm. The radius R2 of the bending section 404 may be smaller than 50 µm.

In some embodiments, the radius R2 may remain constant within the bending section 404. In some embodiments, the radius R2 may vary within the bending section 404. In some embodiments, the radius R2 may increase from the end 450 to the end 452 within the bending section 404. In some embodiments, the radius R2 may decrease from the end 450 to the end 452 within the bending section 404.

Figure 4B:
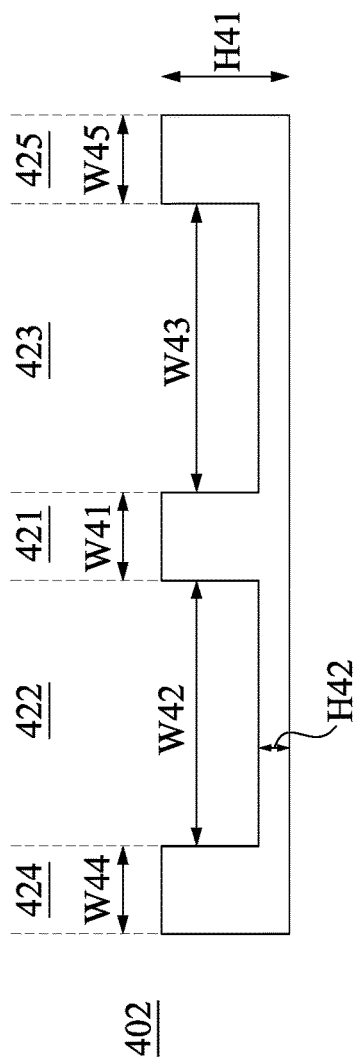
FIG. 4B illustrates a cross-section view of a bending section of a waveguide of the benchmark device along the section line B2-B2' in FIG. 4A, in accordance with some embodiments of the present disclosure.

FIG. 4B illustrates a cross-section view of the bending section 404 of the waveguide 402 of the benchmark device along the section line B2-B2' in FIG. 4A, in accordance with some embodiments of the present disclosure. The waveguide 402 may include several regions 421 to 425. The region 421 can be a central region. The regions 422 and 423 can be slab regions surrounding the region 421. The regions 424 and 425 can be rib regions adjacent to and surrounding the regions 422 and 423. In some embodiments, one of the regions 424 and 425 could be exclusive from the benchmark device. In some embodiments, both of the regions 424 and 425 could be omitted in the benchmark device.

The region 421 can be of width W41 and height H41. In some embodiments, the width W41 of the region 421 may be smaller than 20 µm. The width W41 of the region 421 may be in a range of 0.01 to 10 µm. The width W41 of the region 421 may exceed 1 µm. In some embodiments, the height H41 of the region 421 may be smaller than 20 µm. The height H41 of the region 421 may be in a range of 0.01 to 10 µm. The height H41 of the region 421 may exceed 1 µm.

The region 422 can be of width W42 and height H42. The width W42 of the region 422 is greater than the width W41 of the region 421. In some embodiments, the width W42 of the region 422 may be smaller than 20 µm. The width W42 of the region 422 may be in a range of 0.01 to 10 µm. The width W42 of the region 422 may exceed 1 µm.

The height H42 of the region 422 is smaller than the height H41 of the region 421. In some embodiments, the height H42 of the region 422 may be smaller than 15 µm. The height H42 of the region 422 may be in a range of 0 to 10 µm. The height H42 of the region 422 may exceed 0.01 µm.

The region 423 can be of width W43 and height H42. The width W43 of the region 423 is greater than the width W41 of the region 421. The width W43 of the region 423 may be substantially identical to the width W42 of the region 422. In some embodiments, the width W43 of the region 423 may be smaller than 20 µm. The width W43 of the region 423 may be in a range of 0.01 to 10 µm. The width W43 of the region 423 may exceed 1 µm.

The region 424 can be of width W44 and height H41. The width W44 of the region 424 is smaller than the width W42 of the region 422. The width W44 of the region 424 may be substantially identical to the width W41 of the region 421. In some embodiments, the width W44 of the region 424 may be smaller than 20 μm. The width W44 of the region 424 may be in a range of 0 to 10 μm. The width W44 of the region 424 may exceed 1 μm.

The region 425 can be of width W45 and height H41. The width W45 of the region 425 is smaller than the width W42 of the region 422. The width W45 of the region 425 may be substantially identical to the width W41 of the region 421. In some embodiments, the width W45 of the region 425 may be smaller than 20 μm. The width W45 of the region 425 may be in a range of 0 to 10 μm. The width W45 of the region 425 may exceed 1 μm.

Figure 4C:
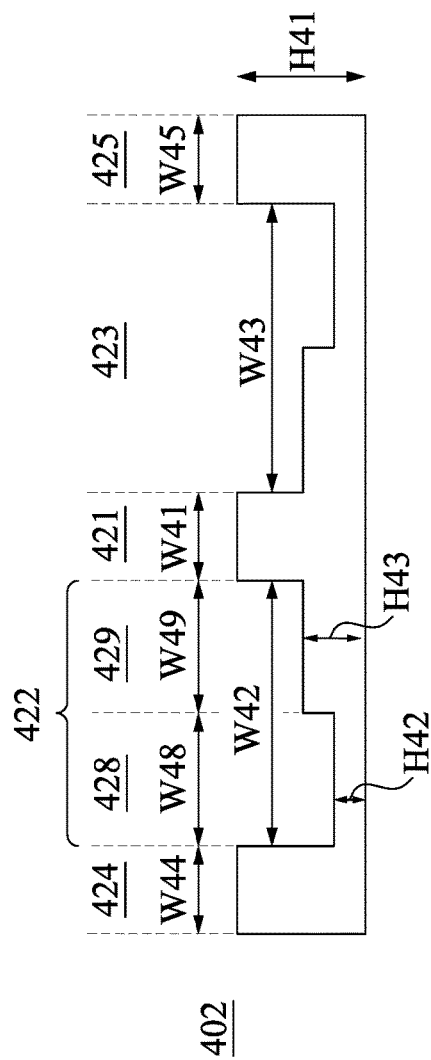
FIG. 4C illustrates another cross-section view of a bending section of a waveguide of the benchmark device along the section line B3-B3' in FIG. 4A, in accordance with some embodiments of the present disclosure.

FIG. 4C illustrates another cross-section view of the bending section 404 of the waveguide 402 of the benchmark device along the section line B3-B3' in FIG. 4A, in accordance with some embodiments of the present disclosure. In some embodiments, the region 422 can include two regions 428 and 429. The region 429 is adjacent to the region 421. The region 429 can be of width W49 and height H43. The region 428 is adjacent to the region 424. The region 428 can be of width W48 and height H42. The total width of the width W48 and the width W49 is the width W42.

In some embodiments, the height H43 could be smaller than the height H41. The height H43 could be greater than the height H42. In some embodiments, the height H43 of the region 429 may be smaller than 15 μm. The height H43 of the region 429 may be in a range of 0 to 10 μm. The height H43 of the region 429 may exceed 0.01 μm.

Figure 4D:
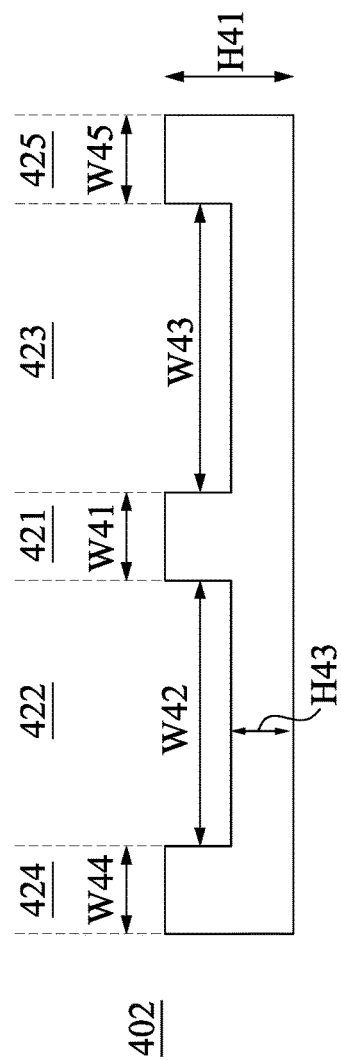
FIG. 4D illustrates another cross-section view of a bending section of a waveguide of the benchmark device along the section line B1-B1' in FIG. 4A, in accordance with some embodiments of the present disclosure.

FIG. 4D illustrates another cross-Isection view of the bending section of the waveguide 402 of the benchmark device along the section line B1-B1' in FIG. 4A, in accordance with some embodiments of the present disclosure. In some embodiments, the region 422 could be of a height H43 which is greater than the height H42. The signal loss of the waveguide 402 could be decreased as the height of the region 422 increases. In some embodiments, the signal loss of the waveguide 402 could be decreased as the width of the region 422 increases.

In some embodiments, the total width of the width W48 and the width W49 is the width W42, because the regions 428 and 429 are included by the region 422. The region 429 could increase as the region 428 decreases. The region 429 could decrease as the region 428 increases. The height of the region 422 can be increased as the portion of the region 429 increases to reduce the signal loss.

In some embodiments, the width W49 decreases gradually from the end 450 (corresponding to the embodiment of FIG. 4D) of the bending section 404 to another end 452 (corresponding to the embodiment of FIG. 4B) of the bending section 404. The width W48 increases gradually from the end 450 (corresponding to the embodiment of FIG. 4D) of the bending section 404 to another end 452 (corresponding to the embodiment of FIG. 4B) of the bending section 404.

The width W41 of the region 421 could remain constant in the bending section 404. The height H41 of the region 421 could remain constant in the bending section 404. The sum of the widths W48 and W49 could remain constant in the bending section 404. The width W44 of the region 424 could remain constant in the bending section 404. The height H41 of the region 424 could remain constant in the bending section 404. The width W45 of the region 425 could remain constant in the bending section 404. The height H41 of the region 425 could remain constant in the bending section 404.

It can be contemplated that, in the present disclosure, all the bending sections can have a structure similar to those of the bending section 404. That is, a slab region of the bending sections in the present disclosure can have several portions with different height/thickness.

Figure 5A:
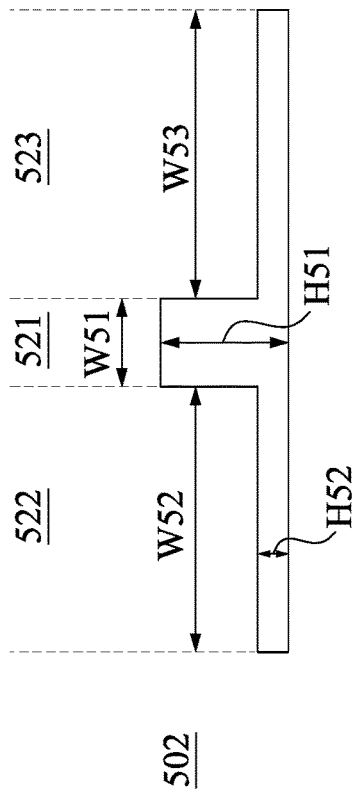
FIG. 5A illustrates a cross-section view of a bending section of a waveguide of the benchmark device along the section line B2-B2' in FIG. 4A, in accordance with some embodiments of the present disclosure.

FIG. 5A illustrates a cross-section view of a bending section of a waveguide of the benchmark device along the section line B2-B2' in FIG. 4A, in accordance with some embodiments of the present disclosure. The embodiment of FIG. 5A differs from the embodiment of FIG. 4B in that the regions 424 and 425 could be omitted in the waveguide 402.

The region 521 can be of width W51 and height H51. In some embodiments, the width W51 of the region 521 may be smaller than 20 μm. The width W51 of the region 521 may be in a range of 0.01 to 10 μm. The width W51 of the region 521 may exceed 1 μm. In some embodiments, the height H51 of the region 521 may be smaller than 20 μm. The height H51 of the region 521 may be in a range of 0.01 to 10 μm. The height H51 of the region 521 may exceed lpm.

The region 522 can be of width W52 and height H52. The width W52 of the region 522 is greater than the width W51 of the region 521. In some embodiments, the width W52 of the region 522 may be smaller than 20 μm. The width W52 of the region 522 may be in a range of 0.01 to 10 μm. The width W52 of the region 522 may exceed 1 μm.

The height H52 of the region 522 is smaller than the height H51 of the region 521. In some embodiments, the height H52 of the region 522 may be smaller than 15 μm. The height H52 of the region 522 may be in a range of 0 to 10 μm. The height H52 of the region 522 may exceed 0.01 μm.

The region 523 can be of width W53 and height H52. The width W53 of the region 523 is greater than the width W51 of the region 521. The width W53 of the region 523 may be substantially identical to the width W52 of the region 522. In some embodiments, the width W53 of the region 523 may be smaller than 20 μm. The width W53 of the region 523 may be in a range of 0.01 to 10 μm. The width W53 of the region 523 may exceed 1 μm.

Figure 5B:
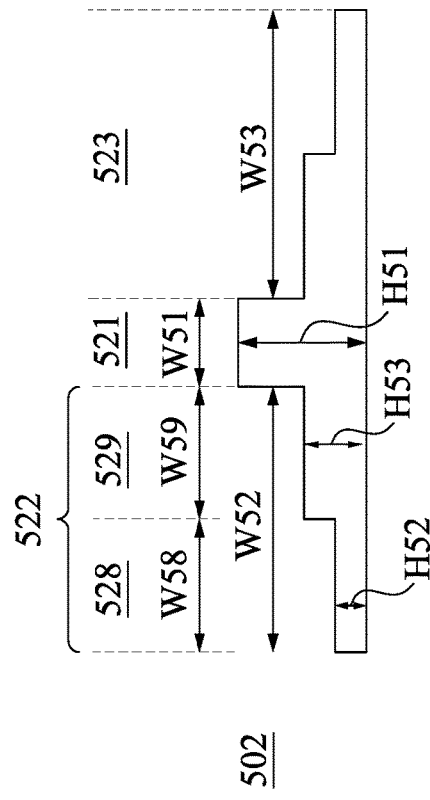
FIG. 5B illustrates another cross-section view of a bending section of a waveguide of the benchmark device along the section line B3-B3' in FIG. 4A, in accordance with some embodiments of the present disclosure.

FIG. 5B illustrates another cross-section view a bending section of a waveguide 502 of the benchmark device along the section line B3-B3' in FIG. 4A, in accordance with some embodiments of the present disclosure. The embodiment of FIG. 5B differs from the embodiment of FIG. 4C in that the regions 424 and 425 could be exclusive from the waveguide 402.

In some embodiments, the region 522 can include two regions 528 and 529. The region 529 is adjacent to the region 521. The region 529 can be of width W59 and height H53. The region 528 is adjacent to the region 529. The region 528 can be of width W58 and height H52. The total width of the width W58 and the width W59 is the width W52.

In some embodiments, the height H53 could be smaller than the height H51. The height H53 could be greater than the height H52. In some embodiments, the height H53 of the region 529 may be smaller than 15 μm. The height H53 of the region 529 may be in a range of 0 to 10 μm. The height H53 of the region 529 may exceed 0.01 μm.

Figure 5C:
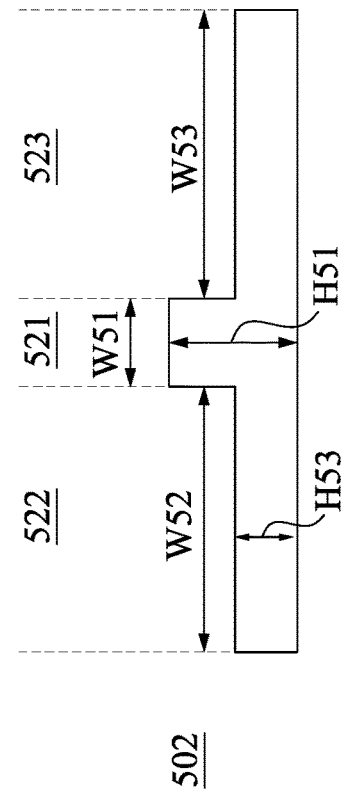
FIG. 5C illustrates another cross-section view of a bending section of a waveguide of the benchmark device along the section line B1-B1' in FIG. 4A, in accordance with some embodiments of the present disclosure.

FIG. 5C illustrates another cross-section view a bending section of a waveguide 502 of the benchmark device along the section line B1-B1' in FIG. 4A, in accordance with some embodiments of the present disclosure. The embodiment of FIG. 5C differs from the embodiment of FIG. 4D in that the regions 424 and 425 could be exclusive from the waveguide. In some embodiments, the region 522 could be of a height H53 which is greater than the height H52. The signal loss of the waveguide 502 could be decreased as the height of the region 522 increases. In some embodiments, the signal loss of the waveguide 502 could be decreased as the width of the region 522 increases.

In some embodiments, the total width of the width W58 and the width W59 is the width W52, because the regions 528 and 529 are included by the region 522. The region 529 could increase as the region 528 decreases. The region 529 could decrease as the region 528 increases. The height of the region 522 can be increased as the portion of the region 529 increases to reduce the signal loss.

In some embodiments, the width W59 decreases gradually from one end of the bending section to another end of the bending section. The width W58 increases gradually from one end of the bending section to another end of the bending section. The width W51 of the region 521 could remain constant in the bending section. The height H51 of the region 521 could remain constant in the bending section. The sum of the widths W58 and W59 could remain constant in the bending section.

Figure 6:
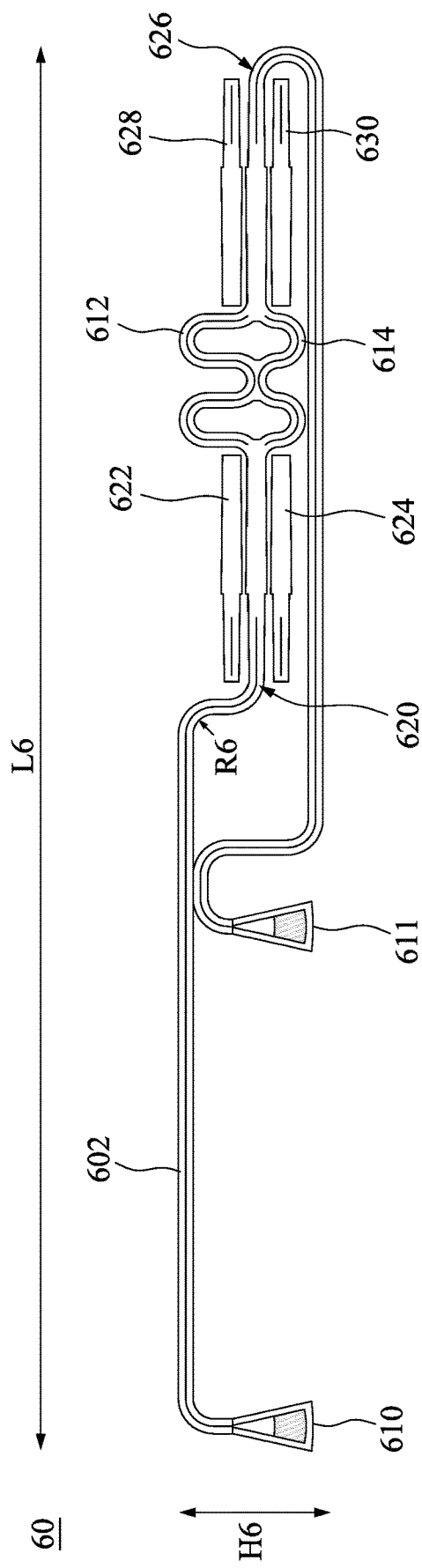
FIG. 6 is a schematic view of a benchmark device for evaluating a semiconductor wafer, in accordance with some embodiments of the present disclosure.

FIG. 6 is a schematic view of a benchmark device 60 for evaluating a semiconductor wafer, in accordance with some embodiments of the present disclosure. The benchmark device 60 can include waveguides 602, 612, 614, grating couplers 610, 611, and splitters 620, 622, 624, 626, 628, and 630. The benchmark device 60 can be formed in a rectangular shape with a length L6 and a height H6. The waveguide 602 of the benchmark device 60 may have one or many bending sections. For example, one of the bending sections may have a radius R6 of a range of 1 to 30 um.

In some embodiments, the splitters 620 to 630 can be used to divide or combine optical signals transmitted by the waveguides 602, 612 and 614. For example, the splitters 620 to 630 can be multi-mode interferometer (MMI) or Mach-Zehnder Interferometer (MZI). In some embodiments, the MZI can include at least one MMI and/or at least one waveguide. The splitters 620 to 630 could be used to extract the refraction rate of the waveguides. The splitters 620 to 630 could be used to extract the reflection rate of the waveguides. The splitters 620 to 630 could be used to extract the diffraction rate of the waveguides.

More specifically, as shown in FIG. 6, the splitter 620 has one input and two outputs. The input of the splitter 620 can be coupled or connected to the waveguide 602. The outputs of the splitter 620 can be coupled or connected to the waveguides 612 and 614. The splitter 626 has two inputs and one output. The inputs of the splitter 626 can be coupled or connected to the waveguides 612 and 614. The output of the splitter 626 can be coupled or connected to the waveguide 602.

In some embodiments, the waveguide 612 may be longer in length than the waveguide 614. The waveguide 612 may be shorter in length than the waveguide 614. The waveguides 612 and 614 may be asymmetric in shape. The waveguides 612 and 614 can have bending section of the same number. The waveguides 612 and 614 can have bending section of different numbers. The waveguide 612 can have more bending sections than the waveguide 614. The waveguide 612 can have less bending sections than the waveguide 614. The bending sections of the waveguide 612 may be greater in radius than those of the waveguide 614. The bending sections of the waveguide 612 may be smaller in radius than those of the waveguide 614.

As shown in FIG. 6, the splitter 622 is adjacent to and spaced apart from the splitter 620. The splitter 622 could be disconnected from the waveguides 602, 612, and 614. The splitter 622 can be a dummy or spare splitter for the splitter 620. In some embodiments, the splitter 624 is adjacent to and spaced apart from the splitter 620. The splitter 624 could be disconnected from the waveguides 602, 612, and 614. The splitter 624 can be a dummy or spare splitter for the splitter 620. The splitter 620 can be arranged between the splitters 622 and 624. The dummy splitter can be used to improve the imbalance of two outputs of the splitter 620 caused by process mismatch, and thus the reliability or stability of the benchmark device 60 can be improved.

In some embodiments, the splitter 628 is adjacent to and spaced apart from the splitter 626. The splitter 628 could be disconnected from the waveguides 602, 612, and 614. The splitter 628 can be a dummy or spare splitter for the splitter 626. In some embodiments, the splitter 630 is adjacent to and spaced apart from the splitter 626. The splitter 630 could be disconnected from the waveguides 602, 612, and 614. The splitter 630 can be a dummy or spare splitter for the splitter 626. The splitter 626 can be arranged between the splitters 628 and 630. The dummy splitters can be used to improve the reliability or stability of the benchmark device 60. In general, the manufacturing process will be stable if several components with identical or similar structures are arranged adjacent/near to each other. Specifically, the splitters 622 and 624 can improve reliability or stability of the splitter 620, and the splitters 628 and 630 can improve reliability or stability of the splitter 626.

Figure 7A:
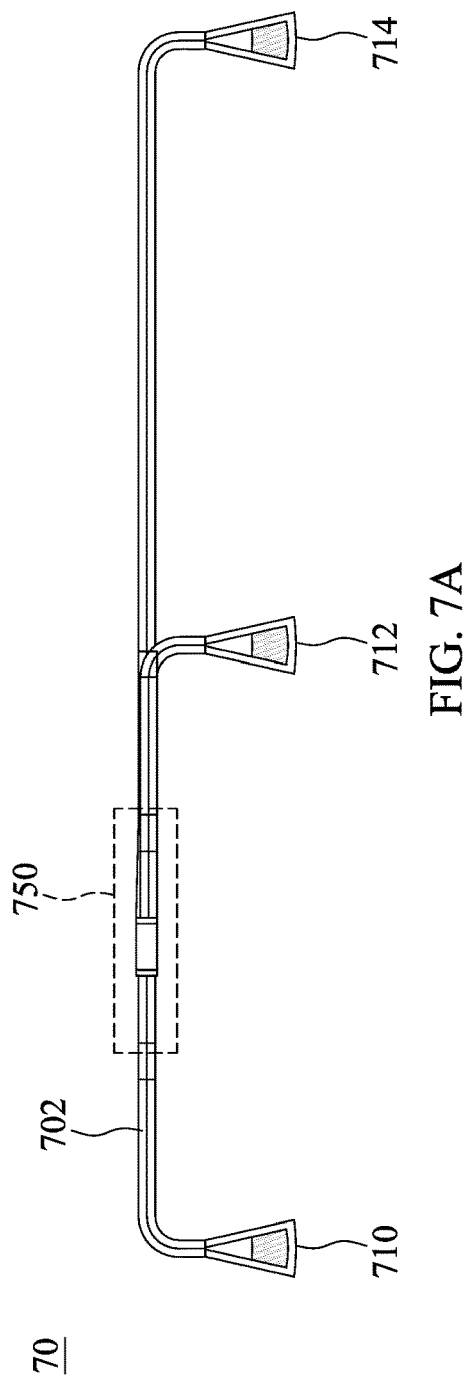
FIG. 7A is a schematic view of a benchmark device for evaluating a semiconductor wafer, in accordance with some embodiments of the present disclosure.

FIG. 7A is a schematic view of a benchmark device 70 for evaluating a semiconductor wafer, in accordance with some embodiments of the present disclosure. The benchmark device 70 can include a waveguide 702, a splitter 750 and grating couplers 710, 712, and 714. The splitter 750 may have one input and two outputs. The input of the splitter 750 can be coupled or connected to the grating coupler 710 through one or more waveguides. The outputs of the splitter 750 can be coupled or connected to the grating couplers 712 and 714 through one or more waveguides.

Figure 7B:
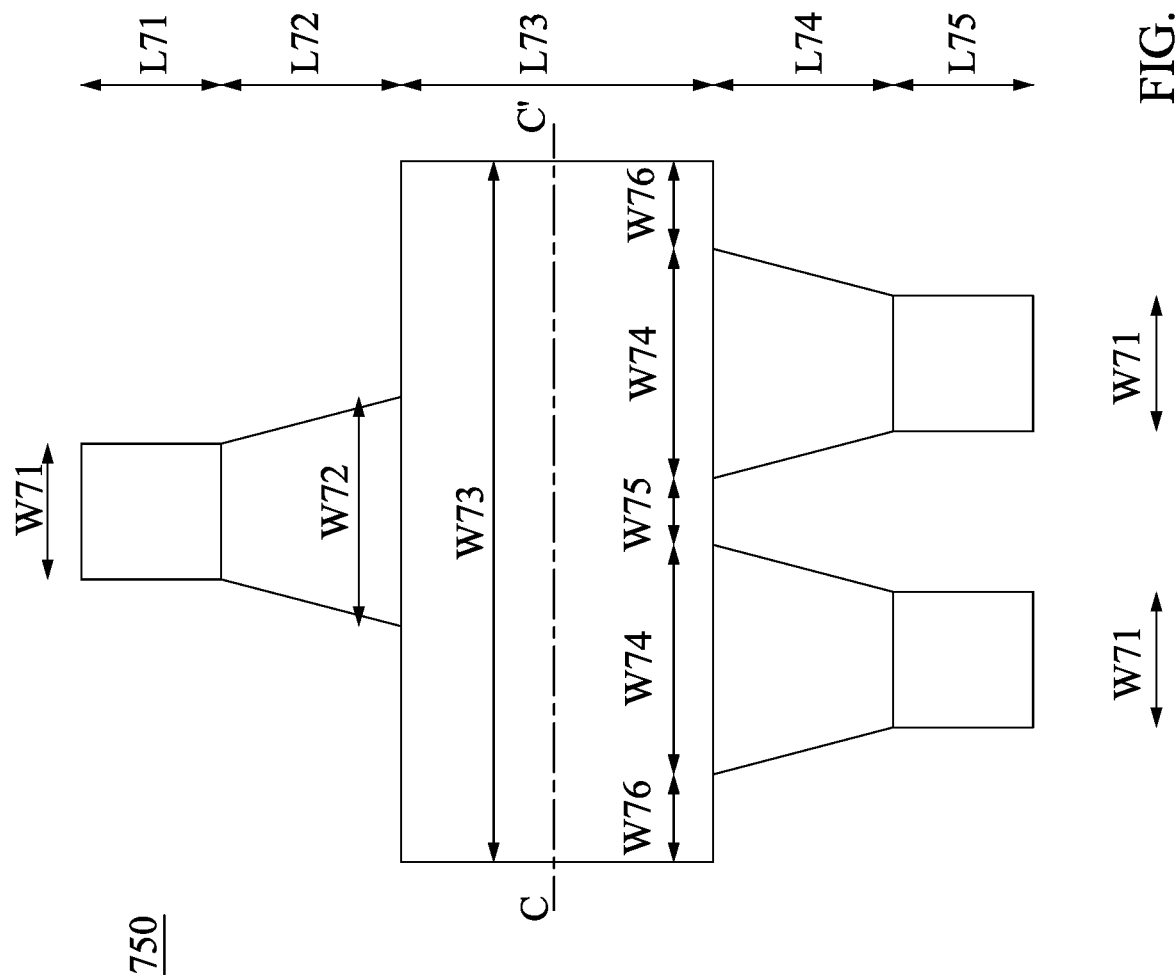
FIG. 7B is a schematic view of a splitter of a benchmark device for evaluating a semiconductor wafer, in accordance with some embodiments of the present disclosure.

FIG. 7B is a schematic view of the splitter 750 of the benchmark device 70 for evaluating a semiconductor wafer, in accordance with some embodiments of the present disclosure. The input of the splitter 750 can include two portions of different length and width. The outputs of the splitter 750 can include two portions of different length and width.

The splitter 750 could be used to evenly divide the optical signal from the waveguide 702 into two portions. The splitter 750 could be used to unevenly divide the optical signal from the waveguide 702 into two portions. As a result, the characteristics of the semiconductor wafer can be accurately monitored or measured due to the increasing of the signal path by the division of the splitter 750.

In some embodiments, the first portion of the input of the splitter 750 may be of width W71 and length L71. The width W71 may be smaller than the length L71. The width W71 can be of a range between 0.01 to 10 μm. The length L71 can be of a range between 0.01 to 100 μm. In some embodiments, the second portion of the input of the splitter 750 may be of width W72 and length L72. The width W72 can be varying and the length L72 can remain constant. The width W72 may be smaller than the length L72. The width W72 can be of a range between 0.01 to 10 μm. The length L72 can be of a range between 0.01 to 100 μm.

The central portion of the splitter 750 can be of a rectangular shape with length L73 and width W73. The width W73 can include several widths W74 to W76 in correspondence with the two outputs of the splitter 750. The width W73 may be greater than the length L73. The width W73 can be of a range between 0.01 to 10 µm. The length L73 can be of a range between 0.01 to 100 µm.

In some embodiments, the first portion of each of the outputs of the splitter 750 may be of width W71 and length L75. The width W71 may be smaller than the length L75. The width W71 can be of a range between 0.01 to 10 µm. The length L75 can be of a range between 0.01 to 100 µm. In some embodiments, the second portion of each of the outputs of the splitter 750 may be of width W74 and length L74. The width W74 can be varying and the length L74 can remain constant. The width W74 may be smaller than the length L74. The width W74 can be of a range between 0.01 to 10 µm. The length L74 can be of a range between 0.01 to 100 µm. Moreover, the width W75 can be of a range between 0 to 10 µm. The width W76 can be of a range between 0 to 10 µm.

Figure 7C:
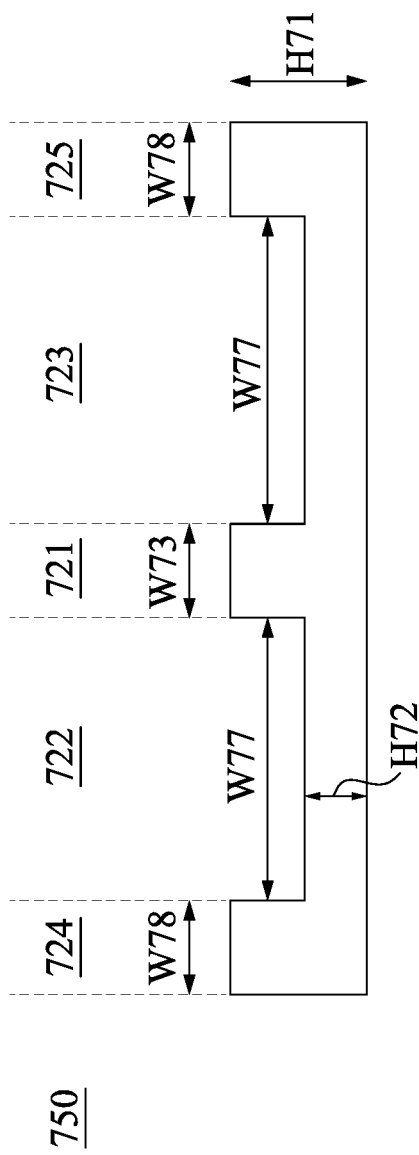
FIG. 7C illustrates a cross-section view of the splitter of the benchmark device along the section line C-C' in FIG. 7B, in accordance with some embodiments of the present disclosure.

FIG. 7C illustrates a cross-section view of the splitter 750 of the benchmark device along the section line C-C' on the central portion in FIG. 7B, in accordance with some embodiments of the present disclosure. The splitter 750 may include several regions 721 to 725. The region 721 can be a central region. The regions 722 and 723 can be slab regions surrounding the region 721. The regions 724 and 725 can be rib regions adjacent to and surrounding the regions 722 and 723. In some embodiments, one of the regions 724 and 725 could be exclusive from the benchmark device. In some embodiments, both of the regions 724 and 725 could be exclusive from the benchmark device.

The region 721 can be of width W73 and height H71. In some embodiments, the width W73 of the region 721 may be smaller than 20 µm. The width W73 of the region 721 may be in a range of 0.01 to 10 µm. The width W73 of the region 721 may exceed 1 µm. In some embodiments, the height H71 of the region 721 may be smaller than 20 µm. The height H71 of the region 721 may be in a range of 0.01 to 10 µm. The height H71 of the region 721 may exceed 1 µm.

The region 722 can be of width W77 and height H72. The width W77 of the region 722 is greater than the width W73 of the region 721. In some embodiments, the width W77 of the region 722 may be smaller than 20 µm. The width W77 of the region 722 may be in a range of 0.01 to 10 µm. The width W77 of the region 722 may exceed 1 µm.

The height H72 of the region 722 is smaller than the height H71 of the region 721. In some embodiments, the height H72 of the region 722 may be smaller than 15 µm. The height H72 of the region 722 may be in a range of 0 to 10 µm. The height H72 of the region 722 may exceed 0.01 µm.

The region 723 can be of width W77 and height H72. The width W77 of the region 723 is greater than the width W73 of the region 721. The width W77 of the region 723 may be substantially identical to the width W77 of the region 722. In some embodiments, the width W77 of the region 723 may be smaller than 20 µm. The width W77 of the region 723 may be in a range of 0.01 to 10 µm. The width W77 of the region 723 may exceed 1 µm.

The region 724 can be of width W78 and height H71. The width W78 of the region 724 is smaller than the width W77 of the region 722. The width W78 of the region 724 may be substantially identical to the width W73 of the region 721. In some embodiments, the width W78 of the region 724 may be smaller than 20 µm. The width W78 of the region 724 may be in a range of 0 to 10 µm. The width W78 of the region 724 may exceed 1 µm.

The region 725 can be of width W78 and height H71. The width W78 of the region 725 is smaller than the width W77 of the region 722. The width W78 of the region 725 may be substantially identical to the width W73 of the region 721. In some embodiments, the width W78 of the region 725 may be smaller than 20 µm. The width W78 of the region 725 may be in a range of 0 to 10 µm. The width W78 of the region 725 may exceed 1 µm.

Figure 8A:
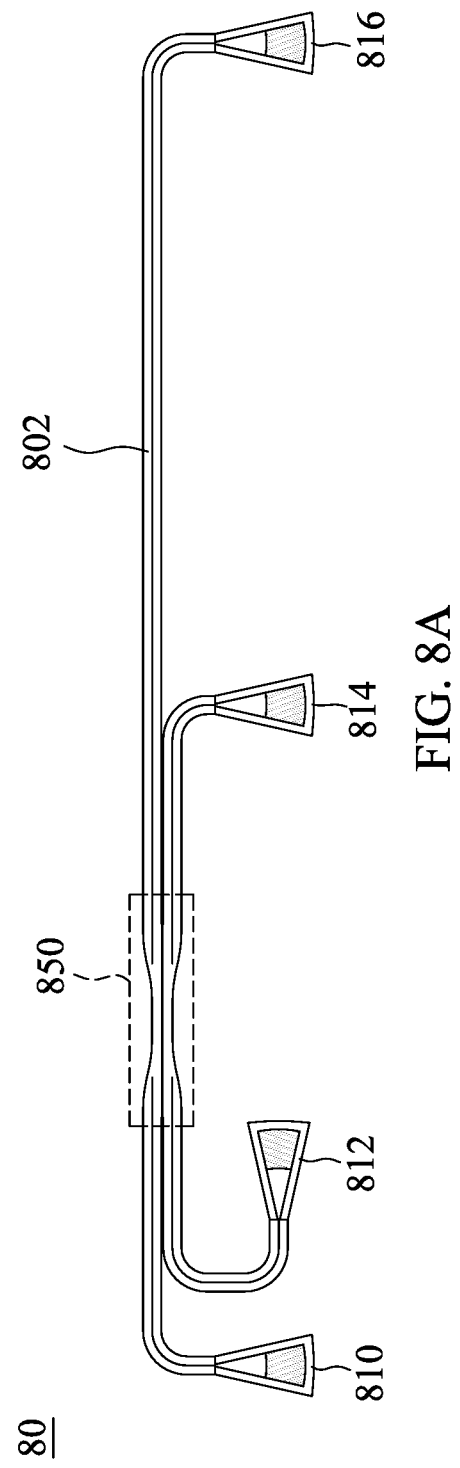
FIG. 8A is a schematic view of a benchmark device for evaluating a semiconductor wafer, in accordance with some embodiments of the present disclosure.

FIG. 8A is a schematic view of a benchmark device 80 for evaluating a semiconductor wafer, in accordance with some embodiments of the present disclosure. The benchmark device 80 can include a waveguide 802, a splitter 850 and grating couplers 810, 812, 814, and 816. The splitter 850 may have two inputs and two outputs. The inputs of the splitter 850 can be coupled or connected to the grating couplers 810 and 812 through one or more waveguides. The outputs of the splitter 850 can be coupled or connected to the grating couplers 814 and 816 through one or more waveguides.

Figure 8B:
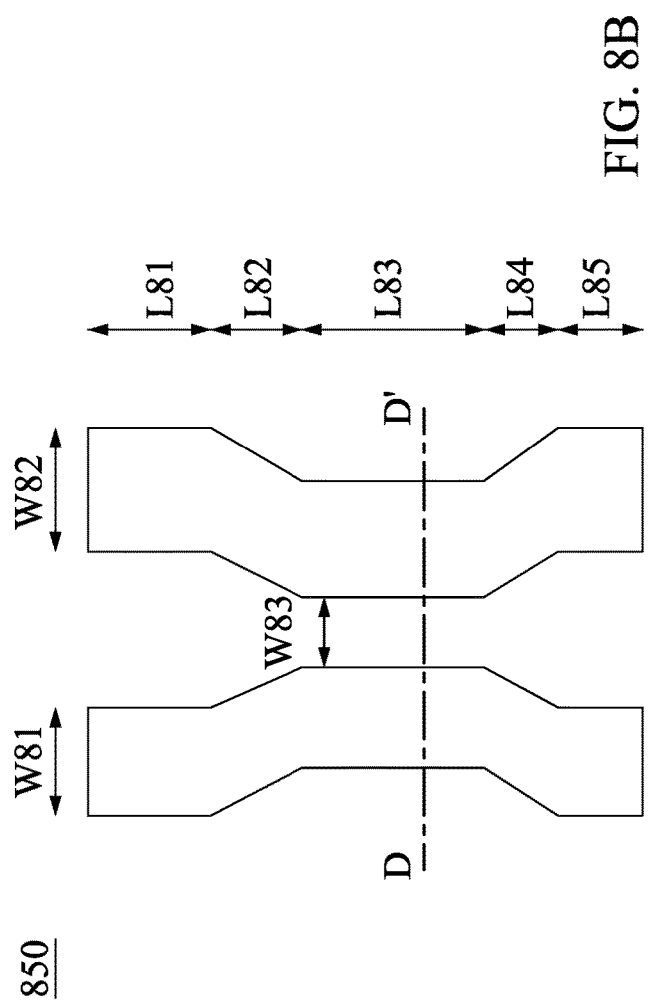
FIG. 8B is a schematic view of a splitter of a benchmark device for evaluating a semiconductor wafer, in accordance with some embodiments of the present disclosure.

FIG. 8B is a schematic view of a splitter 850 of the benchmark device for evaluating a semiconductor wafer, in accordance with some embodiments of the present disclosure. The splitter 850 may include two portions with widths of W81 and W82. The distance between the two portions could be the width W83. Each of the portions can include multiple sections of different lengths L81 to L85.

In some embodiment, the width W81 may be in a range of 0.01 to 10 µm. The width W82 may be in a range of 0.01 to 10 µm. The width W83 can be smaller than the widths W81 and W82. The width W83 may be in a range of 0.01 to 10 µm. Each of the lengths L81 to L85 may be in a range of 0.01 to 10 µm. The length L83 could be greater than the lengths L81, L82, L84 and L85.

In some embodiment, a ration of the optical signals shared between the two inputs of the splitter is different from that of the two outputs. For example, the difference of the amount of optical signals between the two inputs of the splitter 850 can be smaller than that of the two outputs of the splitter 750. The difference of the amount of optical signals between the two inputs of the splitter 850 can be greater than that of the two outputs of the splitter 750. Therefore, the signal paths of the benchmark device 80 could be adjusted or changed in a wide variety to improve the accuracy of evaluating the performance of the semiconductor wafer.

Figure 8C:
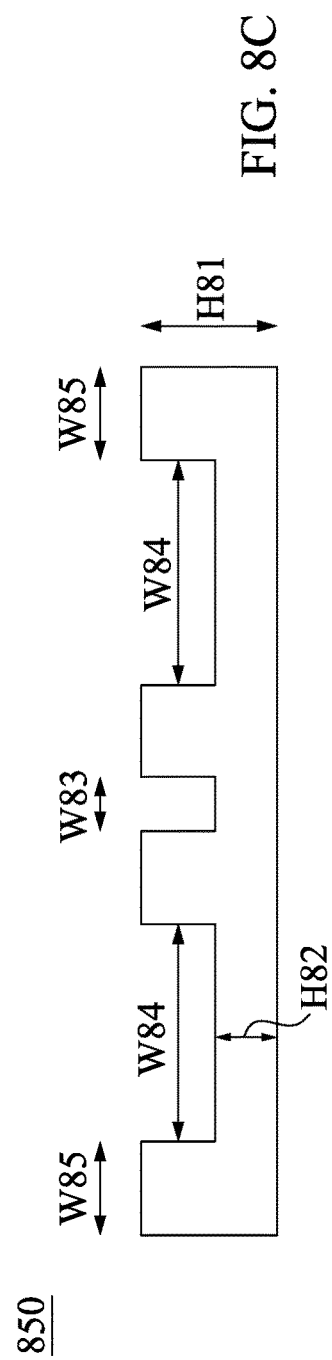
FIG. 8C illustrates a cross-section view of the splitter of the benchmark device along the section line D-D' in FIG. 8B, in accordance with some embodiments of the present disclosure.

FIG. 8C illustrates a cross-section view of the splitter 850 of the benchmark device along the section line D-D' in FIG. 8B, in accordance with some embodiments of the present disclosure. The distance of width W83 between two portions of the splitter 850 can be in a range of 0.01 to 10 µm. Each of the portions of the splitter 850 can include different widths W84, W85 and heights H81, H82.

More specifically, the width W84 can be greater than the width W85. The width W84 can be in a range of 0.01 to 10 µm. The width W85 can be in a range of 0.01 to 10 µm. The length H81 can be greater than the length H82. The length H81 can be in a range of 0.01 to 10 µm. The length H82 can be in a range of 0 to 10 µm.

Figure 9A:
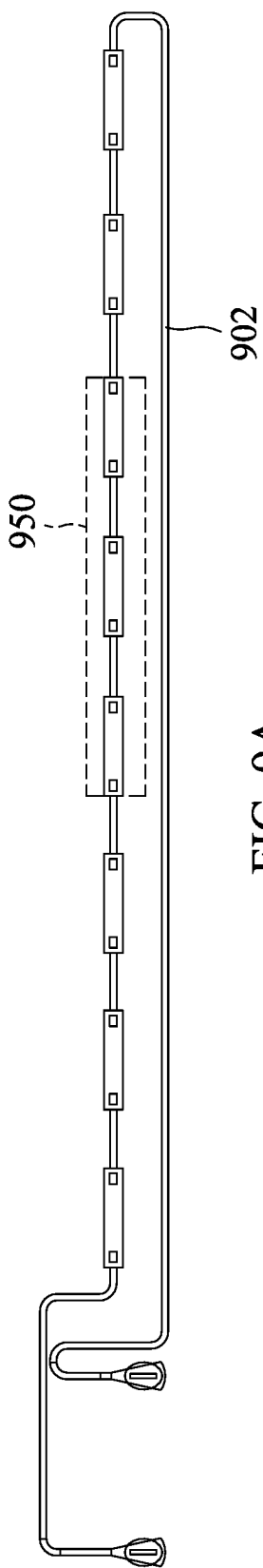
FIG. 9A is a schematic view of a benchmark device for evaluating a semiconductor wafer, in accordance with some embodiments of the present disclosure.

FIG. 9A is a schematic view of a benchmark device 90 for evaluating a semiconductor wafer, in accordance with some embodiments of the present disclosure. The benchmark device 90 can include a set of splitters 950 and at least one waveguide 902. The set of splitters 950 can be used to extract the insertion loss (IL) in order to further measure or monitor the semiconductor wafer. The IL of the input grating coupler could be compared to the IL of the output grating coupler.

Figure 9B:
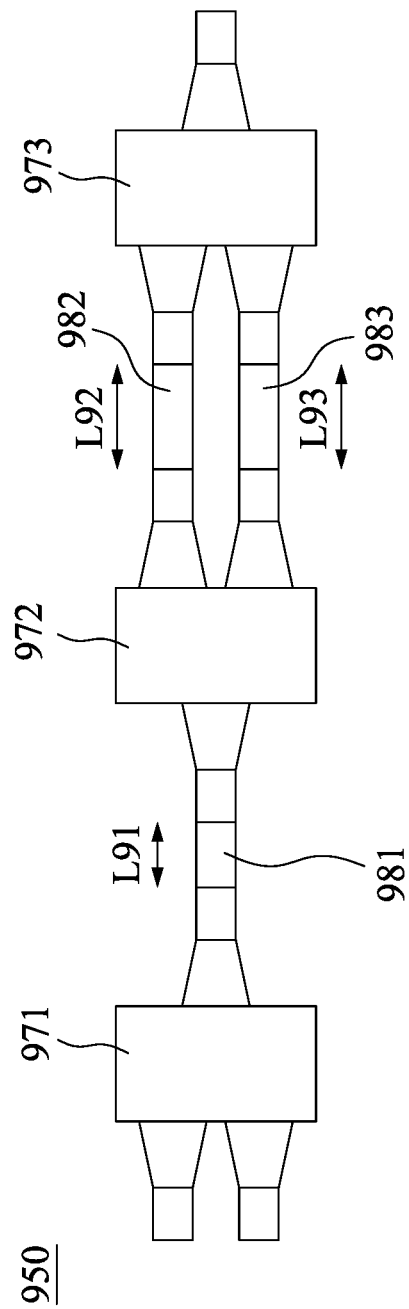
FIG. 9B is a schematic view of splitters and connectors of a benchmark device for evaluating a semiconductor wafer, in accordance with some embodiments of the present disclosure.

FIG. 9B is a schematic view of a set of splitters and connectors of the benchmark device for evaluating a semiconductor wafer, in accordance with some embodiments of the present disclosure. The set of splitters 950 can include several splitters 971 to 973. Each of the splitters 971 to 973 could be isolated or separated from each other. Each of the splitters 971 to 973 may be identical to each other. Each of the splitters 971 to 973 may be different from each other.

In some embodiments, several connectors 981 to 983 could be provided for the set of splitters 950. Each one of the connectors 981 to 983 can be arranged between any two of the splitters 971 to 973. For example, a connector 981 of length L91 could be provided between the splitters 971 and 972. Two connectors 982 and 983 of lengths L92 and L93 could be provided between the splitters 972 and 973.

The lengths L91 to L93 can be in a range of 0.01 to 100 μm. However, each one of the connectors 981 to 983 can have different lengths L91 to L93. The lengths L91 to L93 of the connectors 981 to 983 can be randomly distributed. As a result, the ripple due to multi-stage resonating could be avoid to stabilize the operation and measurement of the benchmark device 90.

Figure 10:
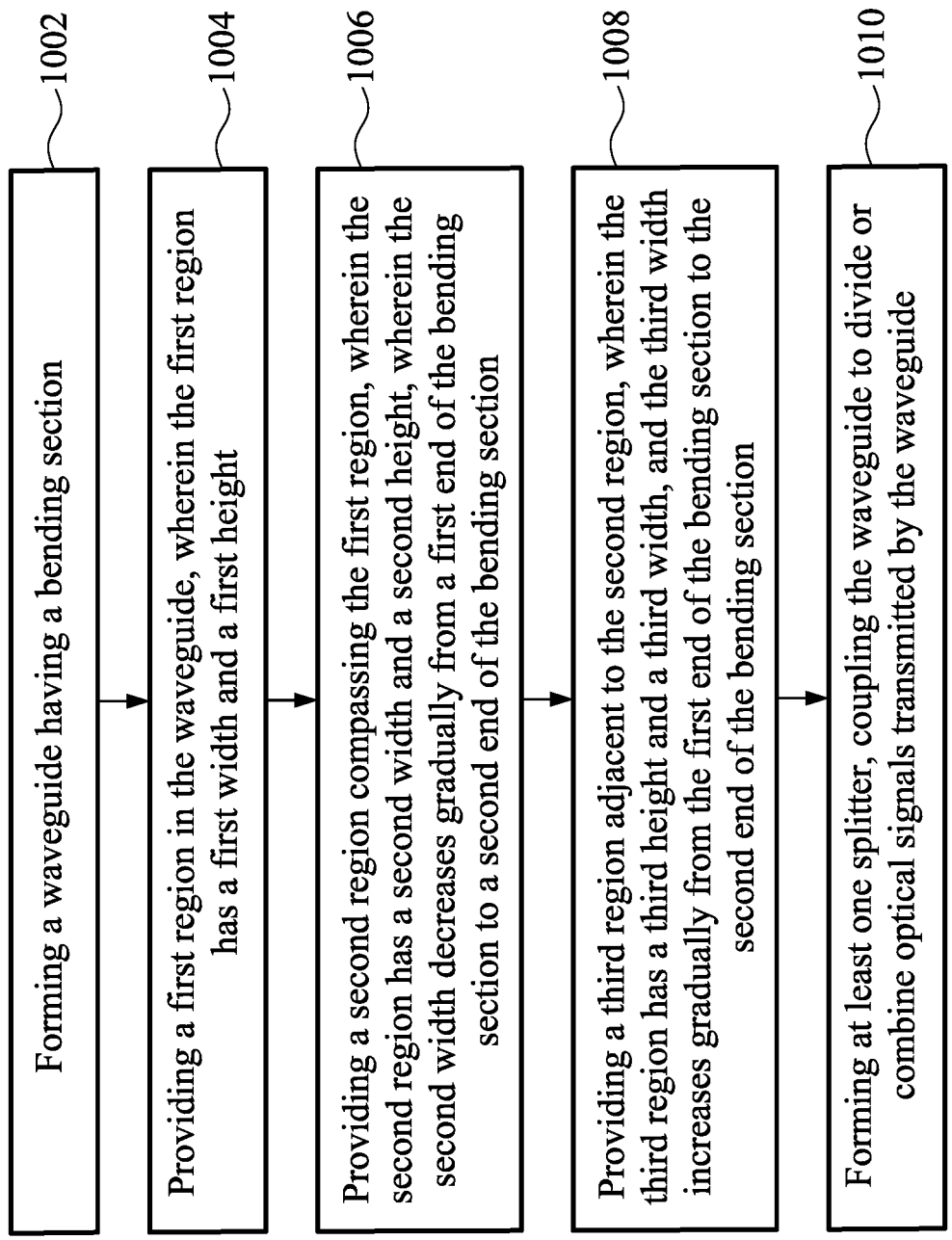
FIG. 10 illustrates a flow chart including operations for evaluating a semiconductor wafer, in accordance with some embodiments of the present disclosure.

FIG. 10 illustrates a flow chart including operations 1002 to 1010 for evaluating a semiconductor wafer, in accordance with some embodiments of the present disclosure. In operation 1002, a waveguide having a bending section is formed. In operation 1004, a first region is provided in the waveguide, and the first region has a first width and a first height. In operation 1006, a second region compassing the first region is provided. The second region has a second width and a second height. The second width decreases gradually from a first end of the bending section to a second end of the bending section In operation 1008, a third region is provided adjacent to the second region. The third region has a third height and a third width. The third width increases gradually from the first end of the bending section to the second end of the bending section. In operation 1010, at least one splitter is formed for coupling the waveguide to divide or combine optical signals transmitted by the waveguide.

While disclosed operations 1002 to 1010 are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Some embodiments of the present disclosure provide a benchmark device. The benchmark device includes a first grating coupler, a second grating coupler and a waveguide. The waveguide has a least one bending section and is arranged in communication with the first grating coupler and the second grating coupler. The bending section includes a first region having a first width and a first height, and a second region having a second width and a second height, wherein the first region is surrounded by the second region, and the second width decreases gradually from a first end of the bending section to a second end of the bending section.

Some embodiments of the present disclosure provide a benchmark device. The benchmark device includes a first grating coupler, a second grating coupler, at least one waveguide, and a first splitter. The waveguide is arranged in communication with the first grating coupler and the second grating coupler. The first splitter couples the at least one waveguide to divide or combine optical signals transmitted by the at least one waveguide.

Some embodiments of the present disclosure provide a method for evaluating a semiconductor wafer. The method includes forming a waveguide having a bending section; providing a first region in the waveguide, wherein the first region has a first width and a first height; providing a second region compassing the first region, wherein the second region has a second width and a second height, wherein the second width decreases gradually from a first end of the bending section to a second end of the bending section; and providing a third region adjacent to the second region, wherein the third region has a third height and a third width, and the third width increases gradually from the first end of the bending section to the second end of the bending section.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A benchmark device embedded within a semiconductor wafer, comprising:
   a first grating coupler;
   a second grating coupler; and
   a waveguide having a least one bending section, arranged in communication with the first grating coupler and the second grating coupler, wherein the bending section comprises:
      a first region having a first width and a first height; and
      a second region having a second width and a second height, wherein the first region is surrounded by the second region, and the second width decreases gradually from a first end of the bending section to a second end of the bending section.

2. The benchmark device of claim 1, wherein the bending section further comprises:
   a third region having a third height and a third width, wherein the third width increases gradually from the first end of the bending section to the second end of the bending section.

3. The benchmark device of claim 2, wherein the second region is formed between the first region and the third region.

4. The benchmark device of claim 2, wherein the second height is smaller than the first height, and the third height is smaller than the second height.

5. The benchmark device of claim 2, wherein the first height, the first width remain constant in the bending section, and a sum of the second width and the third width remain constant in the bending section.

6. The benchmark device of claim 4, further comprising:
   a fourth region with a fourth width and fourth height, wherein the fourth region is adjacent to the third region.

7. The benchmark device of claim 6, wherein the fourth height is greater than the second height and the third height.

8. The benchmark device of claim 1, wherein the first grating coupler, the second grating coupler and the waveguide are arranged within a rectangular area of the semiconductor wafer, and the first grating coupler and the second grating coupler are arranged perpendicular to a longer edge of the rectangular area.

9. The benchmark device of claim 1, wherein the first grating coupler, the second grating coupler and the waveguide are arranged within a rectangular area of the semiconductor wafer, and the first grating coupler and the second grating coupler are arranged in parallel to a longer edge of the rectangular area.

10. A benchmark device, comprising:
a first grating coupler;
a second grating coupler;
at least one waveguide, arranged in communication with the first grating coupler and the second grating coupler;
a first splitter, coupling the at least one waveguide to divide or combine optical signals transmitted by the at least one waveguide; and
a plurality of connectors, arranged between any two of the first splitter and a plurality of fifth splitters, wherein each one of the connectors is configured to connect an output of one of the first splitter and the fifth splitters with an input of another one of the first splitter and the fifth splitters.

11. The benchmark device of claim 10, wherein the first splitter has an input and two outputs; the two outputs of the first splitter are connected to a first waveguide and a second waveguide; each of the first waveguide and the second waveguide includes a bending section, and the first wave guide is longer in length than the second waveguide.

12. The benchmark device of claim 11, further comprising:
a second splitter, adjacent to and spaced apart from the first splitter, wherein the second splitter is disconnected from the at least one waveguide.

13. The benchmark device of claim 11, further comprising:
a third splitter having two inputs and one output, wherein the two inputs of the third splitter are connected to the first wave guide and the second waveguide.

14. The benchmark device of claim 13, further comprising:
a fourth splitter, adjacent to and spaced apart from the third splitter, wherein the fourth splitter is disconnected from the at least one waveguide.

15. The benchmark device of claim 10, wherein the first splitter has two inputs and two outputs, and a ration of the optical signals shared between the two inputs is different from that of the two outputs.

16. The benchmark device of claim 15, wherein the first splitter comprises a first portion and a second portion, and a distance between the first portion and the second portion is smaller than widths of the first portion and the second portion.

17. The benchmark device of claim 10, wherein each one of the connectors has different length.

18. The benchmark device of claim 10, wherein the first splitter comprises:
a first region having a first width and a first height; and
second regions having a second width and a second height, wherein the first region is sandwiched by the second regions, the first height is greater than the second height, and the first width is smaller than the second width.

19. A method for evaluating a semiconductor wafer, comprising:
forming a waveguide having a bending section;
providing a first region in the waveguide, wherein the first region has a first width and a first height;
providing a second region compassing the first region, wherein the second region has a second width and a second height, wherein the second width decreases gradually from a first end of the bending section to a second end of the bending section; and
providing a third region adjacent to the second region, wherein the third region has a third height and a third width, and the third width increases gradually from the first end of the bending section to the second end of the bending section.

20. The method of claim 19, further comprising:
forming at least one splitter, coupling the waveguide to divide or combine optical signals transmitted by the waveguide.

* * * * *